(12) United States Patent
Chen et al.

(10) Patent No.: US 7,768,866 B2
(45) Date of Patent: Aug. 3, 2010

(54) METHOD AND SYSTEM FOR PREVENTING NOISE DISTURBANCE IN HIGH SPEED, LOW POWER MEMORY

(75) Inventors: Ti Wen Chen, Tainan (TW); Yi Te Shih, Zhubei (TW); Pei Hsun Liao, Luodong Township (TW); Ho Hsuan Liu, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/381,484

(22) Filed: May 3, 2006

(65) Prior Publication Data
US 2007/0258304 A1 Nov. 8, 2007

(51) Int. Cl.
*G11C 8/00* (2006.01)
(52) U.S. Cl. .................... 365/233.1; 365/222
(58) Field of Classification Search ................ 365/233, 365/222, 233.1
See application file for complete search history.

(56) References Cited

U.S. PATENT DOCUMENTS

| 4,355,377 | A | 10/1982 | Sud et al. |
| 6,445,621 | B1 | 9/2002 | Heightley |
| 6,504,789 | B2 * | 1/2003 | Hirakawa ................... 365/233 |
| 6,642,763 | B2 * | 11/2003 | Dike ........................... 327/202 |
| 6,828,839 | B2 | 12/2004 | Saeki |
| 6,882,189 | B2 | 4/2005 | Tam et al. |
| 6,914,830 | B2 | 7/2005 | Merritt et al. |
| 7,256,826 | B2 * | 8/2007 | Sasaki ........................ 348/251 |
| 2006/0158935 | A1 * | 7/2006 | Chan et al. ............. 365/185.17 |
| 2006/0187732 | A1 * | 8/2006 | Matsuzaki ................. 365/222 |

* cited by examiner

*Primary Examiner*—Amir Zarabian
*Assistant Examiner*—Jason Lappas
(74) *Attorney, Agent, or Firm*—Kenta Suzue; Haynes Beffel & Wolfeld LLP

(57) ABSTRACT

A memory device comprises a memory cell and a sense amplifier which has a sensing interval. An output circuit is coupled to the sense amplifier and responsive to a clock signal to accept the signal from the sense amplifier. A first source of timing signals generates a first timing signal in response to an enable signal which is asynchronous relative to the clock signal. A second source of timing signals generates a second timing signal based on the clock signal. A switch selects one of the first and second timing signals at the timing signals for use to define pre-charge and sensing intervals for the sense amplifier. The first source of timing signals is selected during an interval of time corresponding to a clock latency, so that the timing signals define a sensing interval where transitions in the clock signal are outside of the sensing interval.

5 Claims, 6 Drawing Sheets

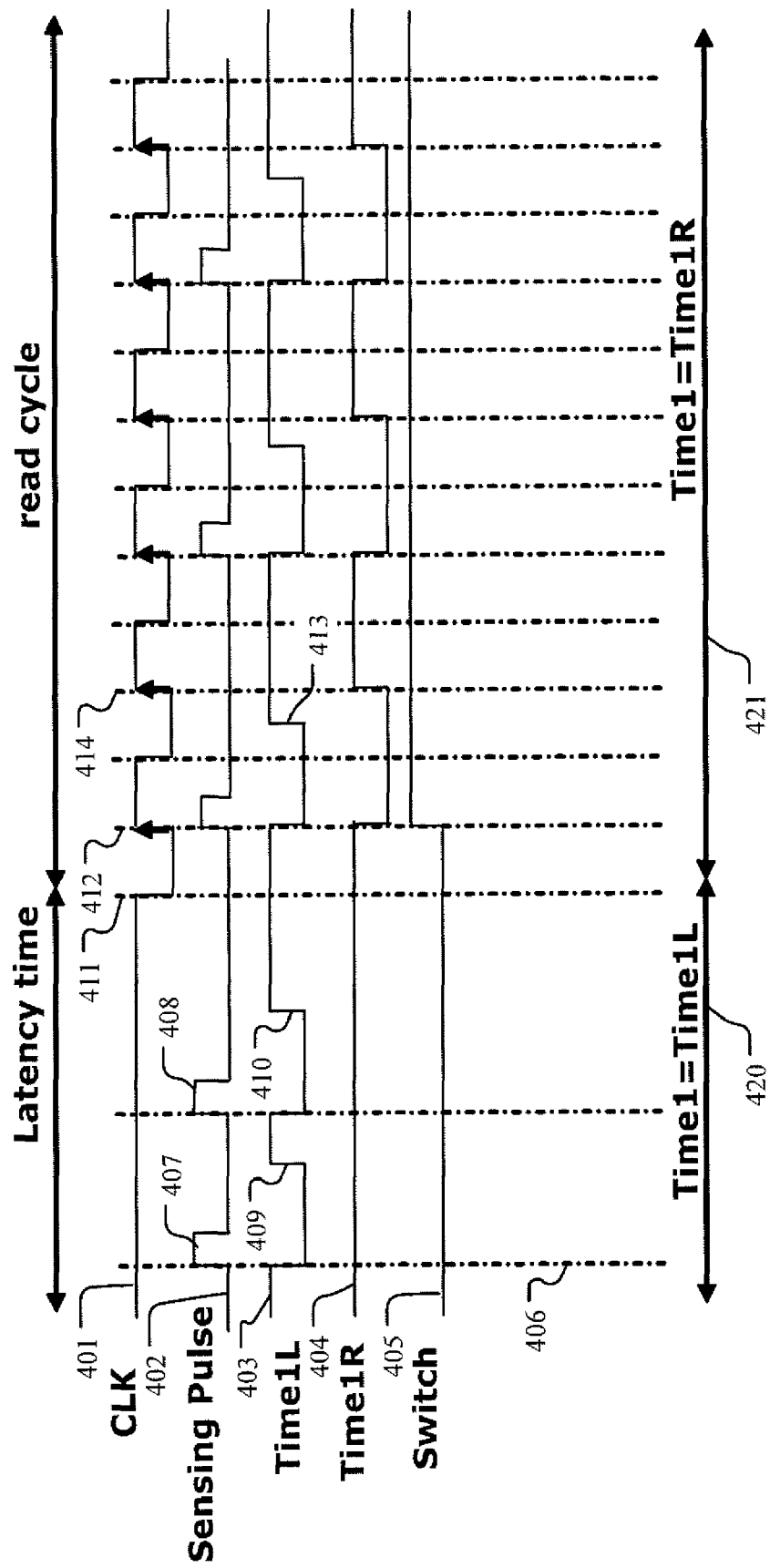

METHOD AND SYSTEM FOR PREVENTING NOISE DISTURBANCE IN HIGH SPEED, LOW POWER MEMORY

BACKGROUND OF THE INVENTION

1. Field of the Invention

The present invention relates to sensing data in high speed, low power memory devices, and the like, and more particularly to preventing disturbance of sensing operations in memory devices due to noise.

2. Description of Related Art

In high speed memory devices, a clock signal used by a circuit reading data from the memory can have a period which is close to or shorter than a memory latency between a signal enabling access to a selected memory cell in the memory, and the time that a signal indicating data from the selected memory cell is available to be sensed. Also, output circuits which accept data from sense amplifiers on the memory can be responsive to the clock signal. High speed sense amplifiers are arranged so that signals from selected memory cells are sensed during sensing intervals at the times which correspond to a memory latency after applying the address signals to select the cells. If the clock signal transitions at the output circuits at a time which can cause noise at the sense amplifiers during the sensing intervals, errors can result in the data being read from the device. The timing of the noise generated is a function of the clock frequency, the memory latency and the clock latency. Thus, it is difficult to design a memory device that is immune to clock signal noise at the sense amplifiers over a specified range of operating frequencies. Also, as power supply voltages drop, the impact of noise is more severe.

FIGS. 1, 2 and 3 illustrate the operation of sense amplifiers and associated output circuits according to the prior art. As shown in FIG. 1, a first type of sense amplifier 10 is coupled to an array 11 by a data line 12. The data line 12 is connected to the input of inverter 13 and to the source of transistor 14. The output of the inverter 13 is connected to the gate of transistor 14. The drain of transistor 14 is connected through a load transistor M1 to a supply voltage VCC. The gate of the load transistor M1 is coupled to a start sensing signal Time1. A voltage Va is developed at the node 15 between the transistor 14 and the load transistor M1 when the start sensing signal Time1 is low in this embodiment. A latch circuit 16 has an input coupled to the node 15, and is responsive to a stop sensing signal Time2. The latch circuit captures the voltage Va developed at node 15 on the rising edge of the stop sensing signal Time2 in this embodiment. The output of the latch circuit 16 is coupled to an output circuit, comprising an input/output buffer 17 in this embodiment. The input/output buffer 17 is responsive to a clock signal CLK to accept the signal from the latch circuit 16 for supply to a device reading data from the memory.

FIG. 2 is a timing diagram illustrating the operation of the sense amplifier 10 of FIG. 1. The clock signal CLK is illustrated on trace 20. The start sensing signal Time1 is illustrated on trace 21. A stop sensing signal Time2 is illustrated on trace 22. The voltage Va developed on node 15 is illustrated on trace 23. In the timing diagram, the clock signal CLK has a period which is the sum of the width tWH between a rising edge and the next falling edge and the width tWL between a falling edge and the next rising edge. The start sensing signal Time1 goes low at time 25 and goes high at time 26. The stop sensing signal Time2 goes high at time 27. When the start sensing signal Time1 goes low, the voltage Va on note 15 is pre-charged to a high level 28. At time 26, the voltage Va on the node 15 is determined by the signal from the selected memory cell on the data line 12. If the signal from the selected memory cell is no current, then the voltage Va remains high during the sensing interval, and the data is interpreted as a logical "0" in this example. If the signal from the selected memory cell is current flow, then the voltage Va is pulled down during the sensing interval, and the data is interpreted as a logical "1" in this example. At time 27 when the stop sensing signal Time2 goes high, the latch circuit 16 captures the value of the voltage Va. The interval between time 26 and time 27 is the sensing interval. The sense amplifier is sensitive to noise occurring during the sensing interval that can affect operation of the latch circuit 16 or the level of the voltage Va. In this example, the clock 20 has a transition from high to low at time 29 during the sensing interval. This transition can generate noise at the node 15, and cause the latch circuit 16 to capture the wrong voltage, leading to erroneous data supplied to the I/O buffer 17.

FIG. 3 illustrates another sense amplifier implementation which encounters the same type of problem. In FIG. 3, a second type of sense amplifier 30 is coupled to an array 31 by a data line 32. A reference memory cell 33 (or array) is coupled to a reference line 34. Column select transistors 35 and 36 are adapted to connect data line 32 and reference line 34, respectively, to nodes 37 and 38. A first load transistor M1 is coupled between node 37 and a supply voltage VCC, and a second load transistor M2 is coupled between node 38 and the supply voltage VCC. The start sensing signal Time1 is coupled to the gates of the load transistors M1 and M2. Nodes 37 and 38 are connected as inputs to a comparator 39. The output of the comparator drives a voltage Va on node 40 which is connected to the input of a latch circuit 41. The latch circuit 41 is responsive to the stop sensing signal Time2. The output of the latch circuit 41 is coupled to an output circuit, such as I/O buffer 42 in this embodiment. The I/O buffer 42 is responsive to the clock signal CLK. The operation of the sense amplifier 30 has timing like that shown in FIG. 2. The voltage V1 and the voltage V2 are pre-charged when the start sense signal Time1 goes low, and are determined by a signal from the reference cell 33 and a signal from a selected memory cell in the array 31, respectively, when the start sense signal Time1 goes high. The comparator develops an output voltage Va on node 40 in response to the difference between voltage V1 and V2. The latch circuit 41 captures the voltage Va when the stop sensing signal Time2 goes high. The output of the latch circuit 41 is captured by the I/O buffer 42 in response to the clock signal CLK. Thus, if the clock signal has a transition during the sensing interval, then noise can affect the voltage Va on node 40, the voltages V1 and V2 on nodes 37 and 38, or operation of the circuitry, and lead to an error in the read operation.

It is desirable to provide a technique suitable for implementation in an integrated circuit memory device which prevents errors due to clock noise during sensing intervals.

SUMMARY OF THE INVENTION

A memory device is described herein that comprises a memory cell and a sense amplifier which has a precharge interval and a sensing interval defined by timing signals, and generates a signal during the sensing interval that indicates a value of data in the memory cell. An output circuit is coupled to the sense amplifier and is responsive to a clock signal to accept the signal from the sense amplifier for supply to a circuit reading data from the memory. A first source of timing signals used to define the pre-charge and sensing intervals, generates a first timing signal having indeterminate timing relative to the clock signal transitions at the output in response to an enable signal. A second source of timing signals used to define the pre-charge and sensing intervals generates a second timing signal based on the clock signal. A switch, such as a multiplexer, is responsive to a control signal to select one of the first and second timing signals as the timing signals defining the pre-charge and sensing intervals for the sense amplifier. The first source of timing signals is selected during an interval of time corresponding to a clock latency. The second source of timing signals is selected after the interval of time, so that the timing signals define a sensing interval where transitions in the clock signal are outside of the sensing interval.

In an embodiment of the device described herein, a sensing pulse generator is included that is responsive to the enable signal. The sensing pulse generator produces a sensing pulse or a sequence of sensing pulses. In this embodiment, the first source of timing signals includes a delay circuit coupled to the sensing pulse generator, and produces the first timing signal with a sense latency relative to the sensing pulse or sensing pulses in the sequence. For example, a representative first source of timing signals is described that includes a delay circuit coupled to the sensing pulse generator, and produces the first timing signal with the sense latency. A representative second source of timing signals is described that includes a synchronizing circuit receiving the first timing signal from the delay circuit and a clock signal. The synchronizing circuit produces the second timing signal synchronized with the clock signal.

An integrated circuit memory device is described that includes a memory array and a set of sense amplifiers, with timing circuitry as described above.

A method for reading a memory device is also described that includes generating a first timing signal to define the pre-charge and sensing intervals in response to an enable signal with indeterminate timing relative to the clock signal at the output; generating a second timing signal to define the pre-charge and sensing intervals based on the clock signal so the transitions in the clock signal are outside of the sensing interval; and selecting one of the first and second timing signal for supply to the sense amplifier.

Other aspects and advantages of the present invention can be seen on review of the drawings, the detailed description and the claims, which follow.

BRIEF DESCRIPTION OF THE DRAWINGS

FIG. 8 is a timing diagram used for illustrating operation of the memory device shown in FIG. 4.

DETAILED DESCRIPTION

A detailed description of embodiments of the present invention is provided with reference to the FIGS. 4-8.

Figure 4:
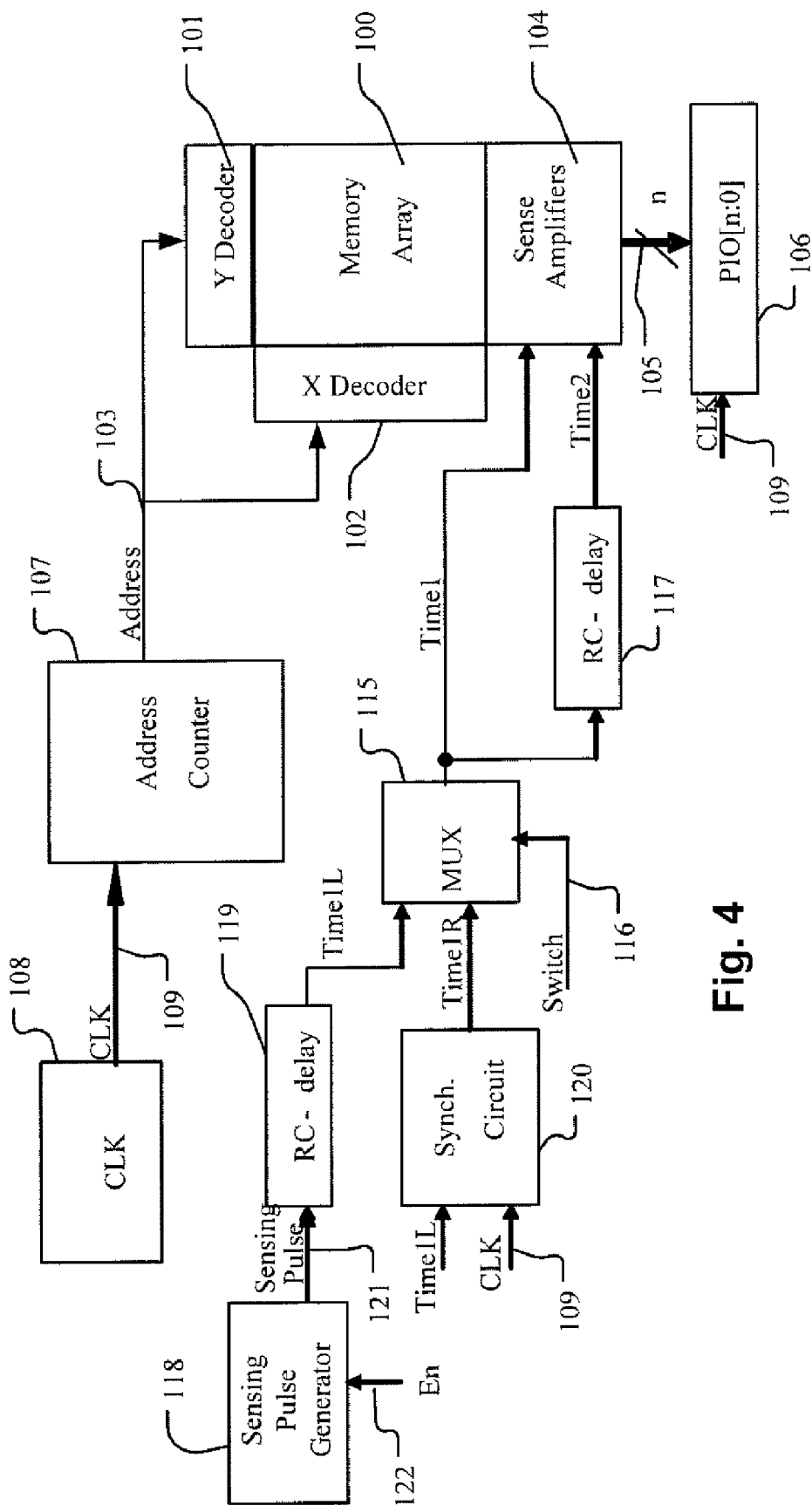
FIG. 4 illustrates a memory device including circuitry to prevent noise during a sensing interval for the sense amplifiers.

FIG. 4 shows an integrated circuit memory device including a memory array 100 coupled with a column decoder 101 and a row decoder 102. The column decoder 101 and row decoder 102 decode addresses from line 103, to control bit lines and word lines, respectively, in order to select memory cells in the array for access. Signals from the selected memory cells are applied to sense amplifiers 104, which in turn supply the output data on bus 105 to an output circuit 106. The addresses are generated by an address counter 107 in the illustrated embodiment. A clock generator 108 which is on-chip in this embodiment, generates a clock signal CLK on line 109 which is distributed on the integrated circuit for controlling a variety of elements. In particular, the clock signal CLK on line 109 is applied to the output circuit 106 for synchronizing the supply of output data to a circuit (not shown) reading the data from the array.

Figure 1:
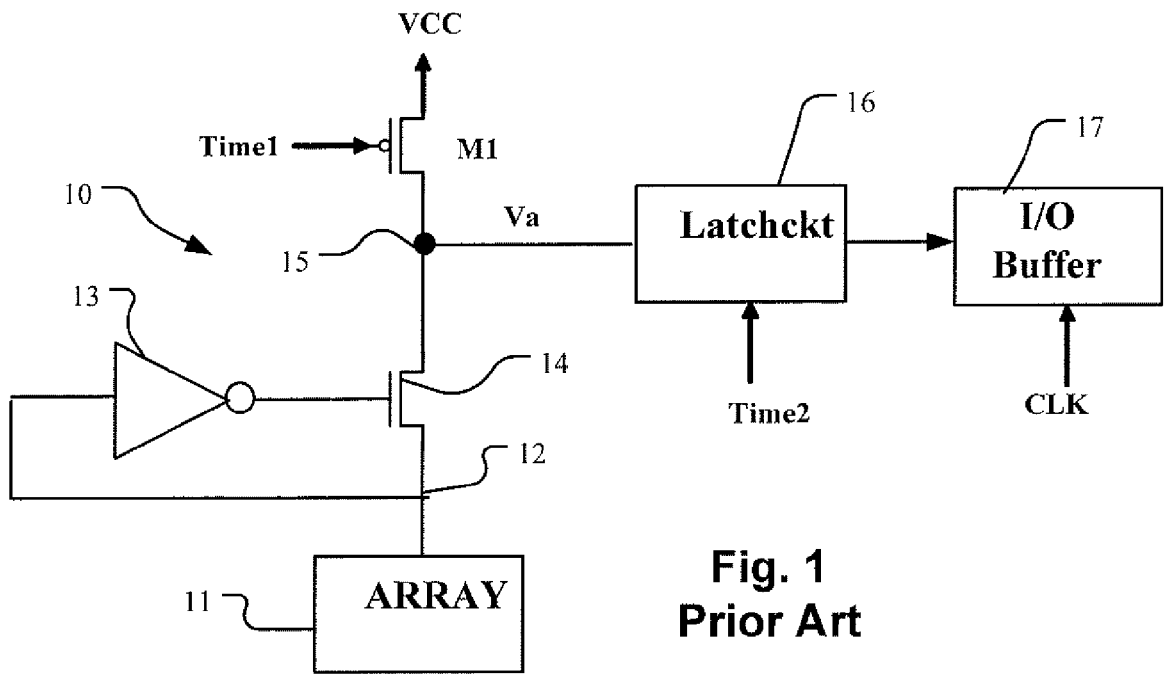
FIG. 1 illustrates a prior art memory device with a first type of sense amplifier.
Figure 2:
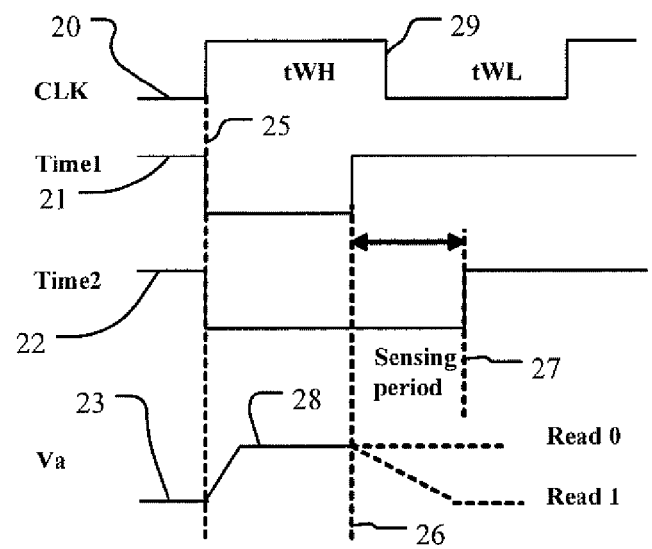
FIG. 2 is a timing diagram used for illustrating operation of the device of FIG. 1.
Figure 3:
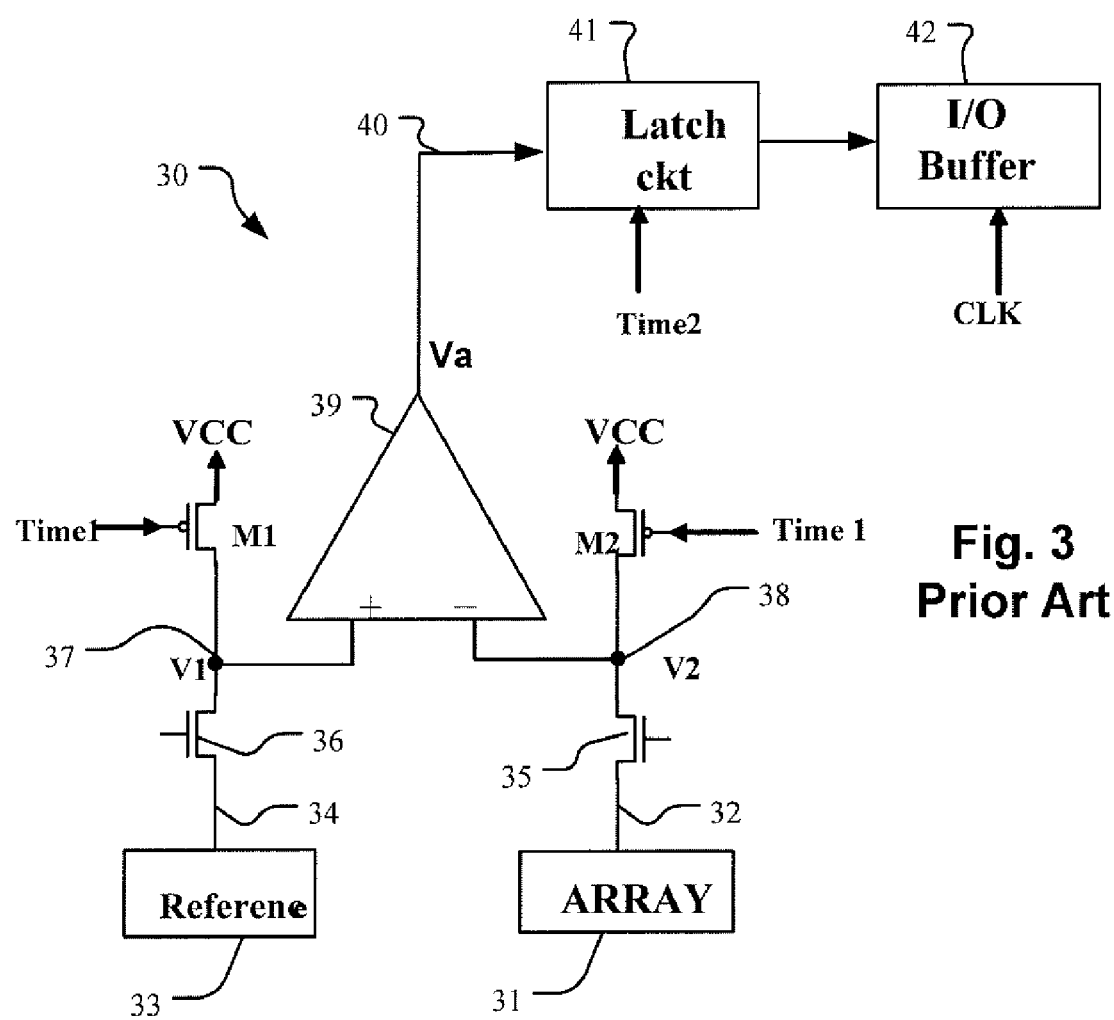
FIG. 3 illustrates a prior art memory device with a second type of sense amplifier.

The sense amplifiers 104 include a set of sense amplifiers which have a pre-charge interval and a sensing interval and are coupled to selected memory cells in the memory array 100 according to the decoding circuitry (column decoder 101, row decoder 102). The pre-charge interval and the sensing interval are defined by timing signals. The timing signals for sense amplifiers in this embodiment, which can be implemented as illustrated in FIG. 1 and FIG. 3, include a start sensing signal Time1 and a stop sensing signal Time2. In this embodiment, the start sensing signal Time1 is supplied at the output of the multiplexer 115 which is responsive to a switch signal on line 116. The stop sensing signal Time2 is applied at the output of the delay circuit 117, which receives the start sensing signal Time1 as input. The delay circuit 117 operates to produce an output which has a falling edge close to the falling edge of the input signal, and a next rising edge which is delayed relative to the next rising edge of the input signal.

Inputs to the multiplexer 115 include first timing signal Time1L and second timing signal Time1R, which are supplied by respective sources of timing signals. The source of the first timing signal Time1L includes sensing pulse generator 118 which is responsive to an enable signal on line 122, such as a chip enable signal typically applied to memory integrated circuits. The sensing pulse generator 118 supplies a sensing pulse or a sequence of sensing pulses on line 121 to a delay circuit 119. Delay circuit 119 operates in a manner similar to that of delay circuit 117, so that a first timing signal Time1L has a falling edge corresponding with a rising edge of the sensing pulse, and a rising edge which is delayed relative to the falling edge of the sensing pulse. The sensing pulses have timing that is indeterminate relative to the clock signal at the output circuit.

The source of the second timing signal Time1R comprises a synchronization circuit 120. The inputs to the synchronization circuit include the first timing signal Time1L and the clock signal CLK from line 109. The output of the synchronization circuit 120 has a falling edge corresponding with the falling edge of the first timing signal Time1L and a rising edge synchronized with the clock signal CLK after the rising edge of the first timing signal Time1L. Thus the second timing signal is based on the clock signal CLK.

In operation, access to the memory array 100 can be initiated by asserting the enable signal on line 122. This results in generation of a sensing pulse or sequence of sequence sensing pulses and in starting of the clock generator 108 to supply the clock signal CLK. An address will be applied to the memory array 100, and a signal from a selected memory cell will be developed at the sense amplifiers 104 after a memory latency. Also, the output circuit 106 will be ready to respond to transitions in the clock signal CLK to latch data output by the sense amplifiers 104. The delay circuit 119 is configured so that the delay between the sensing pulse and the rising edge of the first timing signal Time1L is equal to a sense latency, so that the beginning of the sensing interval defined by the rising edge of the first timing signal Time1L will coincide with a valid signal at the sense amplifiers. The delay circuit 117 is configured so that the delay between the rising edge of the start sensing signal Time1 and the rising edge of the stop sensing signal Time2 defines the sensing interval for the sense amplifiers 104.

The switch signal on line 116 is operated so that the first timing signal Time1L is selected as the start sensing signal Time1 during a first interval of time, and a the second timing signal Time1R is selected as the start sensing signal Time1 after the first interval of time. The source of the switch signal on line 116 is configured so that the first interval of time corresponds with the clock signal latency for the output circuit 106. Therefore, in operation, the sense amplifiers 104 can develop a valid data signal for supply to the output circuit 106 in a manner which overlaps with the clock signal latency, and improves speed of access to the memory array 100 after assertion of the enable signal on line 122. Also, after the clock signal latency, the sensing interval for the sense amplifiers 104 is adjusted so that transitions in the clock signal on line 109 at the output circuit 106 fall outside of the sensing interval and do not generate noise that interferes with the operation of the sense amplifiers 104.

Figure 5:
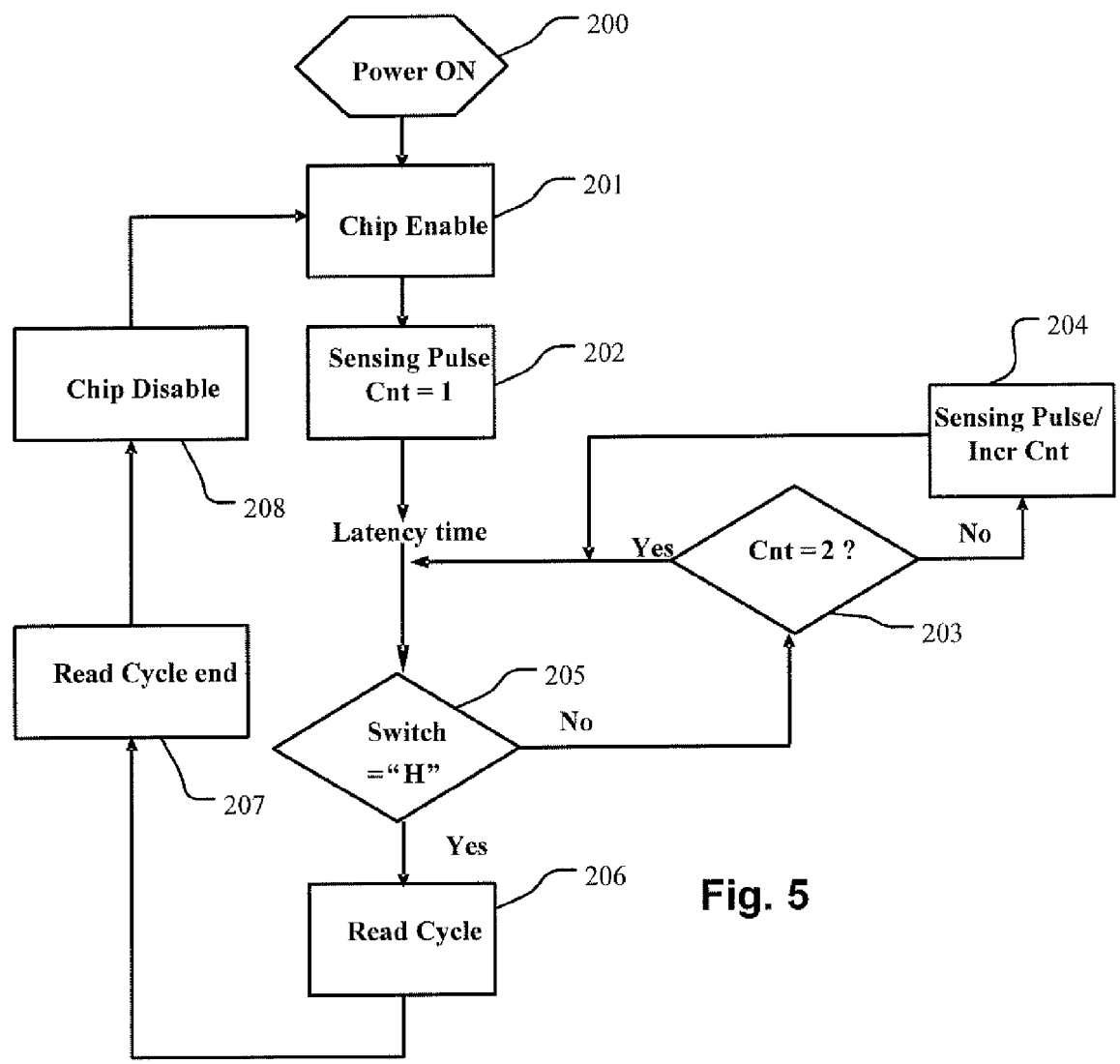
FIG. 5 is a flow chart illustrating operation of the sensing pulse generator for a device like that shown in FIG. 4.

FIG. 5 is a flow chart illustrating operation of the sensing pulse generator 118 of FIG. 5. The sensing pulse generator is enabled at a power-on signal 200. On assertion of the chip enable signal 201, a sensing pulse is generated and a count CNT is set equal to 1 (block 202). During a sense latency time, while the switching signal is low (block 205), the process determines whether two (2) sensing pulses have been generated at block 203, and if not, a second sensing pulse is generated at block 204 and the count CNT is incremented. The process loops back to block 205, and continues to wait until a switch signal goes high. When the switch signal is high, then the read cycle occurs (block 206) and eventually ends (block 207). A chip disable signal may be asserted at block 208, and then the sensing circuit waits for reassertion of the chip enable signal at block 201. During a read cycle, sensing pulses are generated synchronized with the clock signal CLK.

Figure 6:
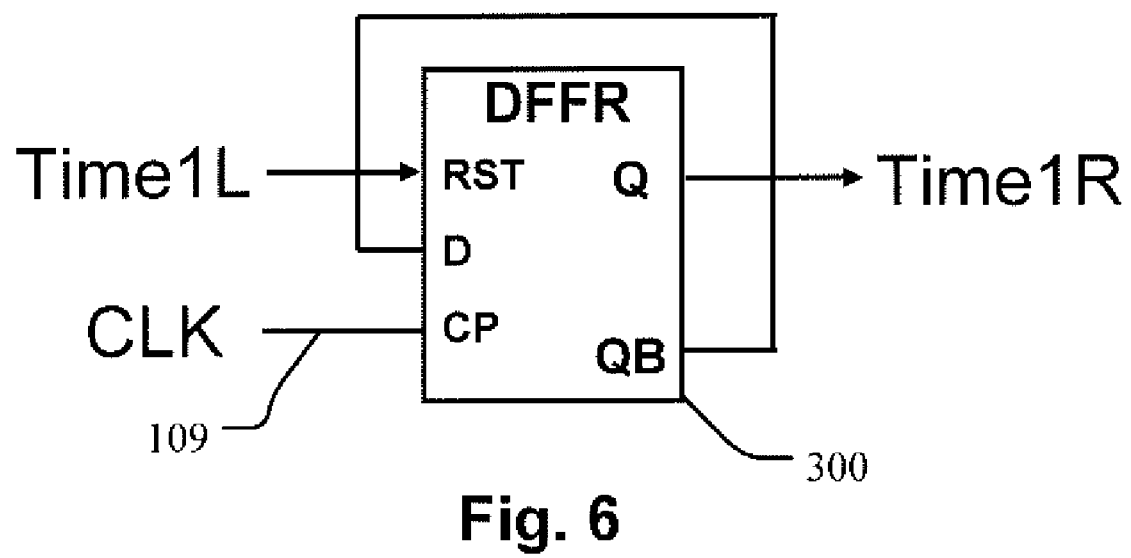
FIG. 6 illustrates an embodiment of a synchronizing circuit for a device like that shown in FIG. 4.

FIG. 6 shows a circuit suitable for use as the synchronizing circuit 120 in the device of FIG. 4. The circuit in FIG. 6 includes a D-type flip-flop 300 which includes a reset input RST, a data input D and a clock input CP. The flip-flop 300 supplies a true output Q and a complement output QB. The reset input RST is coupled to the first timing signal Time1L causing true output Q to fall on the falling edge. The data input D is coupled to a complement output QB, and a clock input CP is coupled to the clock signal CLK. Thus the true output Q rises on the first rising edge of the clock signal CLK after the first timing signal Time1L goes high. Therefore, the second timing signal Time1R has a falling edge synchronized with the clock signal CLK, so that the start sensing pulse Time1 would have a falling edge synchronized with the clock signal CLK, as well. So long as the sensing interval defined by the delay circuit 117 is shorter than the width tWH between rising and falling edges of the clock signal CLK, no transition of the clock signal CLK will occur during the sensing interval.

Figure 7:
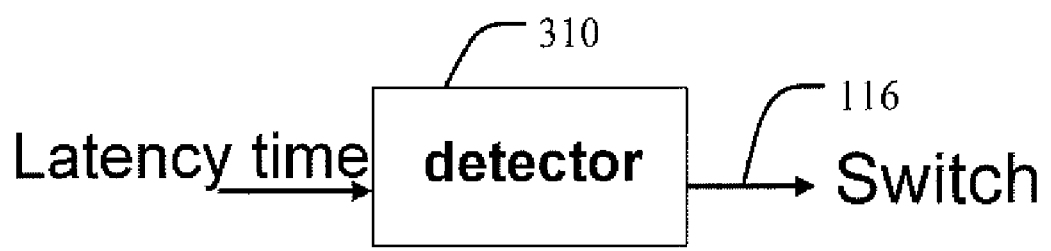
FIG. 7 illustrates an embodiment of a circuit for generating a control signal for the switch for a device like that shown in FIG. 4.

FIG. 7 is a simplified illustration of a source of the switch signal on line 116 which controls the multiplexer 115 in the circuit of FIG. 4. In the illustrated embodiment, the source of the switch signal comprises a detector 310, implementable in a variety of ways known in the art, which detects a time interval corresponding with the clock signal latency for the output circuit 106, and causes a low to high transition of the switch signal on line 116 at the end of the time interval.

FIG. 8 is a timing diagram showing the clock signal CLK, the sensing pulses, the first timing signal Time1L, the second timing signal Time1R, and the switch signal on traces 401-405 respectively. Upon chip enable at time 406, a sequence of sensing pulses 407, 408 is generated. The first timing signal Time1L has a falling edge corresponding with the rising edge of the sensing pulse 407. The first timing signal Time1L has a rising edge at time 409 delayed relative to the falling edge of the sensing pulse 407 by a sensing latency. Likewise, the first timing signal Time1L, has a second falling edge corresponding with the rising edge of the next sensing pulse 408 in the sequence, and a second rising edge at time 410 delayed relative to the falling edge of the sensing pulse 408 by the sensing latency. The clock signal CLK on trace 401 begins after a clock latency at time 411. The switch signal transitions from low to high at time 412 on the first rising edge of the clock signal CLK. After the switch signal transitions from low to high, the second timing signal Time1R is enabled, and the sensing pulses are synchronized with the clock. Thus, a sensing pulse causes the first timing signal Time1L to have a falling edge at time 412, and a second timing signal Time1R to have a falling edge at time 412. The next rising edge at time 413 of the first timing signal Time1L occurs after the sensing latency. The next rising edge at time 414 of the second timing signal Time1R occurs synchronized with the next rising edge of the clock signal CLK. This procedure repeats as long as the clock signal is enabled, and the switch signal remains in the high state. Thus, during the interval represented by line 420, which corresponds to the clock latency, the first timing signal Time1L is used as the start sensing signal Time1. During the interval represented by line 421, which corresponds to the read cycle, the second timing signal Time1R is used as the start sensing signal Time1.

The techniques and circuitry described herein provide a memory device that operates with high speed and low power, over a range of clock frequencies and power supply voltages, while preventing interference with the sense amplifiers caused by noise induced by transitions of the clock signal during sensing intervals in sense amplifiers.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for reading a memory device which has a memory array coupled to a sense amplifier, the method comprising:
   providing a clock signal for synchronizing output data reading from the memory array, the clock signal having a period of oscillation and beginning at an output circuit after a clock latency time, the clock latency time exceeding one period of the clock signal;
   selecting one of a first timing signal and a second timing signal for a start sensing signal which controls the sense amplifier, wherein the first timing signal is selected for the start sensing signal during the clock latency time.

2. The method of claim 1, wherein the second timing signal is selected for the start sensing signal after the clock latency time.

3. The method of claim 1, further comprising:
generating a stop sensing signal from the start sensing signal so that a period between a rising edge of the start sensing signal and a rising edge of the stop sensing signal defines a sensing interval for the sense amplifier.

4. The method of claim 1, wherein the first timing signal is generated from a sequence of sensing pulses.

5. The method of claim 1, wherein the second timing signal has a falling edge corresponding with a falling edge of the first timing signal and a rising edge synchronized with the clock signal after a rising edge of the first timing signal.

\* \* \* \* \*